(12) United States Patent
Kim

(10) Patent No.: US 8,263,460 B2
(45) Date of Patent: Sep. 11, 2012

(54) METHOD FOR MANUFACTURING SEMICONDUCTOR DEVICE WITH BURIED GATES

(75) Inventor: Kyung Do Kim, Seoul (KR)

(73) Assignee: Hynix Semiconductor Inc, Icheon-Si (KR)

( * ) Notice: Subject to any disclaimer, the term of this patent is extended or adjusted under 35 U.S.C. 154(b) by 91 days.

(21) Appl. No.: 12/846,577

(22) Filed: Jul. 29, 2010

(65) Prior Publication Data

US 2011/0248339 A1    Oct. 13, 2011

(30) Foreign Application Priority Data

Apr. 7, 2010    (KR) .................. 10-2010-0031807

(51) Int. Cl.
    *H01L 21/336* (2006.01)
(52) U.S. Cl. .................. 438/270; 257/E21.41
(58) Field of Classification Search .......... 438/270, 438/430, 142, 259, 183, 321, 444; 257/331, 257/E21.545, E21.41
    See application file for complete search history.

(56) References Cited

U.S. PATENT DOCUMENTS

| 7,064,066 B1 * | 6/2006 | Metz et al. .......... 438/680 |
| 2006/0278934 A1 * | 12/2006 | Nagahama .......... 257/369 |
| 2007/0173005 A1 * | 7/2007 | Lee .......... 438/197 |

FOREIGN PATENT DOCUMENTS

| KR | 1019990080898 A | 11/1999 |
| KR | 1020090123690 A | 12/2009 |
| KR | 1020100004649 A | 1/2010 |

* cited by examiner

*Primary Examiner* — A. Sefer
*Assistant Examiner* — Nikolay Yushin

(57) ABSTRACT

A method for manufacturing a semiconductor device comprises forming a buried gate after forming an active region to have a line type. The buried gate comprises an operational gate and a dummy gate. A height of a gate electrode layer (conductive material) of the dummy gate is formed to be lower than that of a gate electrode layer of the operational gate, thereby increasing a threshold voltage and preventing an overlap of the ion-implanted active region with the dummy gate. As a result, a Gate Induced Drain Leakage (GIDL) is prevented to improve a refresh characteristic of the semiconductor device.

16 Claims, 3 Drawing Sheets

METHOD FOR MANUFACTURING SEMICONDUCTOR DEVICE WITH BURIED GATES

CROSS-REFERENCE TO RELATED APPLICATION

The priority of Korean patent application No. 10-2010-0031807 filed on Apr. 7, 2010, the disclosure of which is hereby incorporated in its entirety by reference, is claimed.

BACKGROUND OF THE INVENTION

The present invention relates to a semiconductor device and a method for manufacturing the same that prevents a Gate Induced Drain Leakage (GIDL) to improve a refresh characteristic of the semiconductor device.

In general, a semiconductor memory device comprises of a plurality of unit cells, each including one capacitor and one transistor. The capacitor is used to temporarily store data, and the transistor is used to transfer data between a bit line and the capacitor according to a control signal (word line) using the characteristics of a semiconductor changing an electric conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

To form a transistor on a semiconductor substrate, a gate is formed on the semiconductor substrate and impurities are doped on both sides of the gate to form a source and a drain. In order to increase the data storage capacity of the semiconductor memory device, the size of unit cells needs to be reduced. As the design rule of the capacitor and the transistor comprising the unit cell is decreased, the channel length of a cell transistor becomes gradually reduced. This results in a short channel effect and Drain Induced Barrier Lower (DIBL) occurs, thereby deteriorating the reliability of the transistor characteristics. A phenomena occurring due to the reduction in the channel length can be solved by maintaining a threshold voltage so that the cell transistor may perform a normal operation. In general, the shorter the transistor channel, the larger a doping density of impurities is needed in a channel formation region.

However, when the design rule is reduced to less than 100 nm, a is doping density of impurities in a channel formation region would need to be increased correspondingly. This increases an electric field in a storage node (SN) junction, thereby deteriorating a refresh characteristic of the semiconductor memory device. To prevent the refresh characteristic, a cell transistor having a three dimensional channel structure is used in which a channel is formed in a vertical direction so that a channel length of a transistor can be maintain in spite of a reduction of the design rule. Namely, although a channel dimension in a horizontal direction is short, the doping density can be reduced since the overall channel length is increased by providing a vertical dimension to the channel, thereby preventing the refresh characteristic from being deteriorated.

In addition, with the higher integration of a semiconductor device, there is a shorter distance between a word line and a bit line connected to a cell transistor. As a result, parasitic capacitance is increased to deteriorate an operation margin of a sense amplifier amplifying data transferred through the bit line. This has a bad influence upon the operation reliability of a semiconductor device. A buried word line structure has been proposed to reduce the parasitic capacitance between a bit line and a word line. In this case, in the buried word line structure, the word line is formed within a recess formed on a semiconductor substrate instead of on a surface the substrate. In the buried word line structure, a conductive material is formed in the recess formed in the semiconductor substrate, and an upper portion of the conductive material is covered with an insulating layer to bury the word line in the semiconductor substrate. Accordingly, electric isolation with the bit line formed on the semiconductor substrate on which source/drain are disposed can be clearly achieved.

However, in the buried word line structure, a Gate Induced Drain Leakage (GIDL) characteristic of the semiconductor device between an N-type junction of an active region and a conductive material (gate electrode) is magnified, thereby deteriorating a refresh characteristic of the semiconductor device.

BRIEF SUMMARY OF THE INVENTION

Various embodiments of the invention are directed to providing a method for manufacturing a semiconductor device that comprises forming a buried gate after forming an active region to have a line type. The buried gate comprises an active gate and a dummy gate. A height of a gate electrode layer (conductive material) of the dummy gate is formed to be lower than that of a gate electrode layer of the active gate, thereby increasing a threshold voltage and preventing an overlap of the ion-implanted active region with the dummy gate. As a result, a Gate Induced Drain Leakage (GIDL) is prevented to improve a refresh characteristic of the semiconductor device.

According to an embodiment of the present invention, a method for manufacturing a semiconductor device comprises: forming a device isolation region that defines an active region in a semiconductor substrate; etching the semiconductor substrate with a gate mask as an etching mask to form a gate region; depositing a conductive material on the gate region to form a buried gate including an active gate and a dummy gate; first etching the conductive material of the dummy gate; second etching the conductive material of the active gate and the dummy gate; and depositing an insulating film on the semiconductor substrate.

The active region is formed to have a line type.

The conductive material includes polysilicon, aluminum (Al), tungsten (W), tungsten nitride (WN), titanium (Ti), titanium nitride (TiN) and a deposition structure including titanium nitride (TiN) and tungsten (W).

The forming-a-gate-region includes performing an anisotropic process on the semiconductor substrate.

The first and second etching processes of the conductive material are performed by an anisotropic process on the conductive material.

After depositing the insulating film, the method further comprises performing a chemical mechanical polishing (CMP) on the insulating film to expose the active region.

The active gate and the dummy gate are formed to have a line type.

The height of the conductive material buried in the dummy gate is formed to be lower than that of the conductive material buried in the active gate.

The method further comprises ion-implanting N-type impurities is into the active region to form an N-type junction between forming the device isolation region and forming the gate region.

According to another embodiment of the present invention, a method for manufacturing a semiconductor device comprises: forming a device isolation region that defines an active region having a line type in a semiconductor substrate; etching the semiconductor substrate with a gate mask as an etching mask to form a gate region; depositing a conductive material in the gate region to form a buried gate including an active gate and a dummy gate; first etching a conductive material of the active gate and the dummy gate; second etching the conductive material of the dummy gate; and depositing an insulating film on the semiconductor substrate.

The conductive material includes polysilicon, aluminum (Al), tungsten (W), tungsten nitride (WN), titanium (Ti), titanium nitride (TiN) and a deposition structure including titanium nitride (TiN) and tungsten (W).

The forming-a-gate-region includes performing an anisotropic process on the semiconductor substrate.

The first and second etching processes of the conductive material are performed by an anisotropic process on the conductive material.

The active gate and the dummy gate are formed to have a line type.

The height of the conductive material buried in the dummy gate is formed to be lower than that of the conductive material buried in the is active gate.

After depositing the insulating film, the method further comprises performing a chemical mechanical polishing (CMP) on the insulating film to expose the active region.

According to an embodiment of the present invention, a semiconductor device comprises: a device isolation region that defines an active region in a semiconductor substrate; and a buried gate including an active gate and a dummy gate formed in the semiconductor substrate. A height of a conductive material buried in the dummy gate is formed to be lower than that of the conductive material buried in the active gate.

The active region is formed to have a line type.

The conductive material includes polysilicon, aluminum (Al), tungsten (W), tungsten nitride (WN), titanium (Ti), titanium nitride (TiN) and a deposition structure including titanium nitride (TiN) and tungsten (W).

The active gate and the dummy gate are formed to have a line type.

DESCRIPTION OF EMBODIMENTS

The present invention will be described in detail with reference to the attached drawings.

Figure 1:
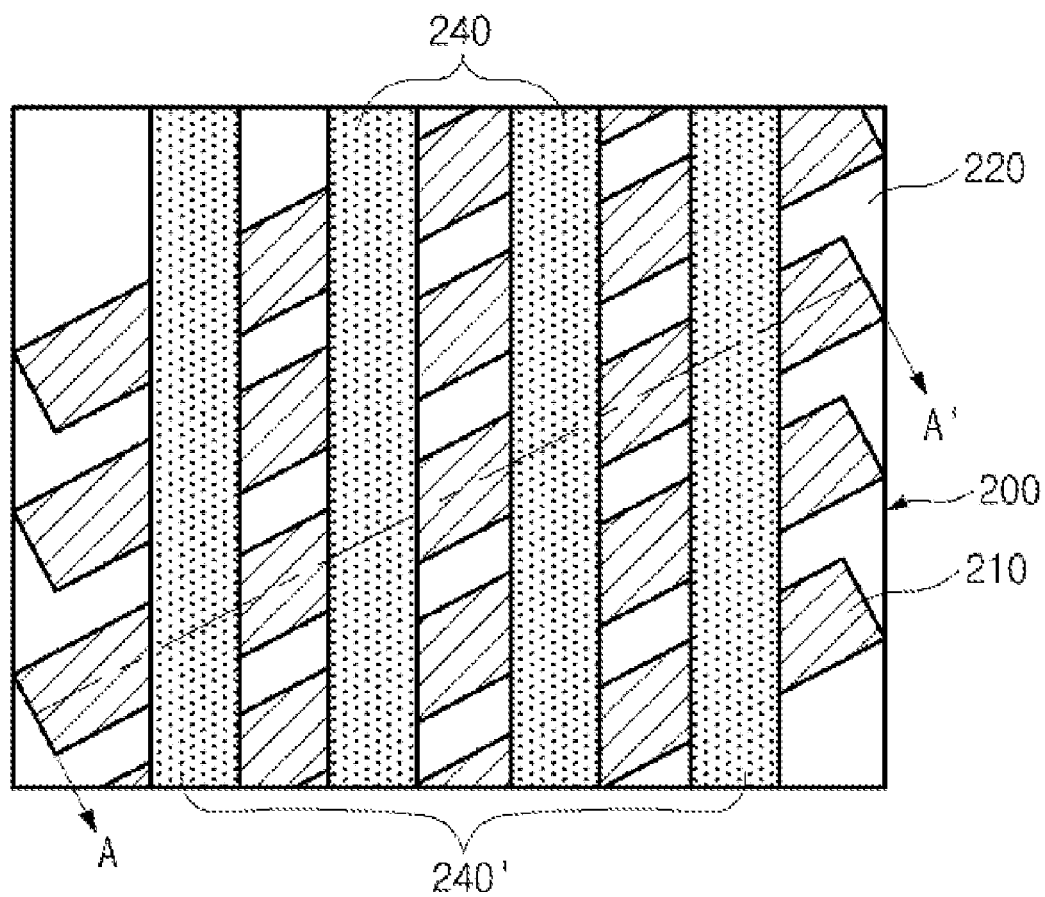
FIG. 1 is a plan view illustrating a semiconductor device and a method for manufacturing the same according to an embodiment of the present invention.

FIG. 1 is a plan view illustrating a semiconductor device and a method for manufacturing the same according to an embodiment of the present invention.

Referring to FIG. 1, a semiconductor substrate 200 includes a device isolation region 220 that defines an active region 210, and buried gates 240, 240' that intersect the active region 210. The active region 210 is formed to have a line type. Buried gates 240, 240' include an active gate (or active gate) 240 and a dummy gate 240' each of which are formed to have a line type.

Figure 2A:
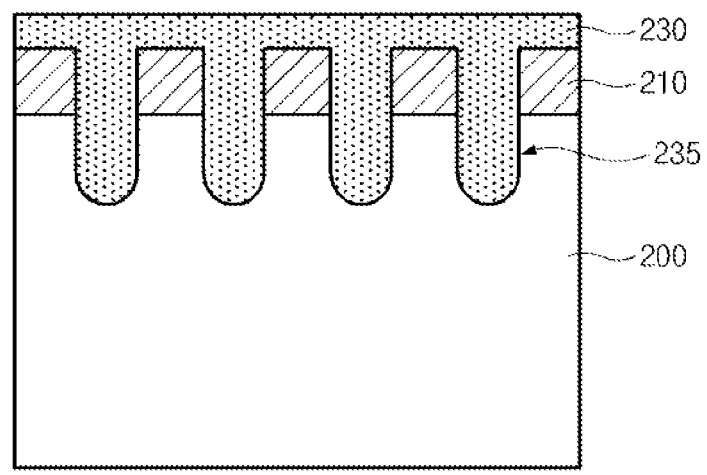
FIGS. 2a to 2c are cross-sectional diagrams illustrating a semiconductor device and a method for manufacturing the same according to an embodiment of the present invention.
Figure 2B:
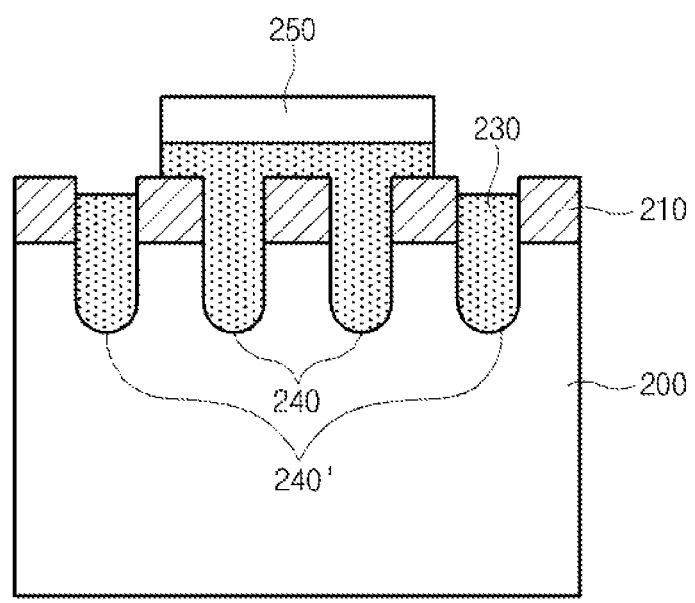
Figure 2C:
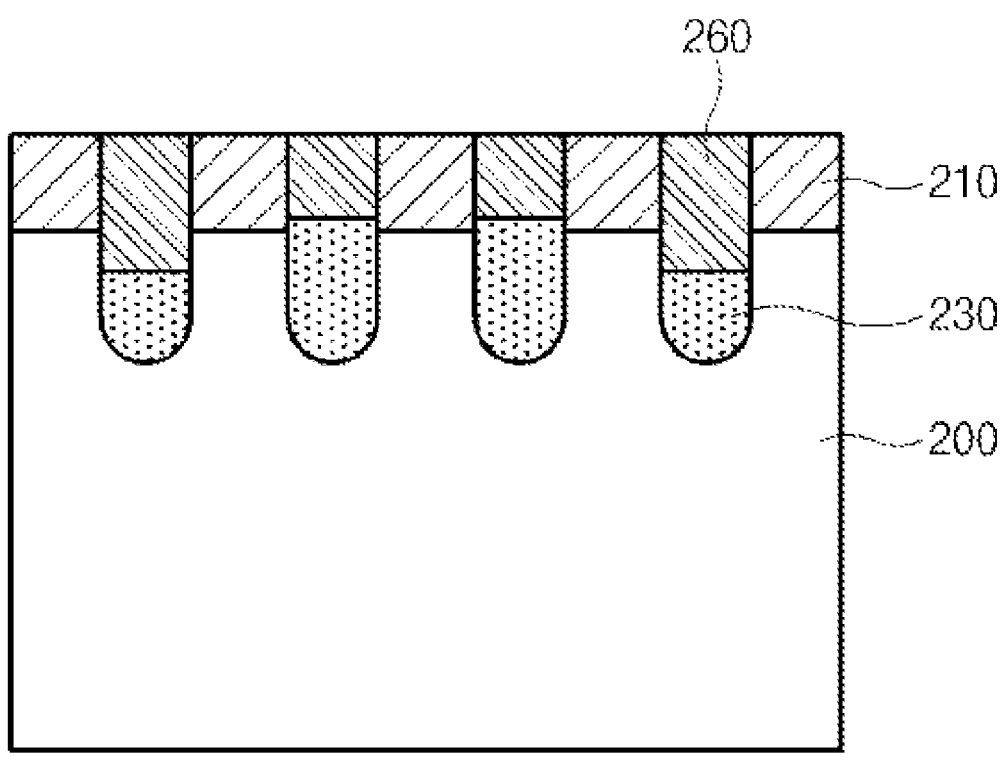

FIGS. 2a to 2c are cross-sectional diagrams taken along A-A' of FIG. 1.

Referring to FIG. 2a, the device isolation region 220 (see FIG. 1) that defines the active region 210 is formed in the semiconductor substrate 200. The active region 210 is formed to have a line type. The device isolation region 220 (see FIG. 1) may be formed by a Shallow Trench Isolation (STI) process. A pad insulating film (not shown) including a pad oxide film and a pad nitride film is deposited on the semiconductor substrate 200. A photoresist film (not shown) is deposited on the pad insulating film, and an exposure process is performed with a mask that defines the active region 210. After the exposed pad insulating film and the semiconductor substrate 200 are is etched to form a trench (not shown), a Spin On Dielectric (SOD) material is used to fill the trench. A Chemical Mechanical Polishing (CMP) process is performed to expose the pad insulating film, thereby forming the device isolation region 220.

After the device isolation region 220 has been formed, an N-type impurity is implanted onto the exposed active region 210. An interlayer insulating film (not shown) is deposited on the resultant surface including the active region 210.

After a photoresist film (not shown) is formed on the interlayer insulating film, an exposure process is performed with a mask that defines a buried gate to pattern the interlayer insulating film. The active region 210 and the device isolation region 220 are etched with the patterned interlayer insulating film as an etching mask to form a gate region (not shown). An etch process for forming the gate region is performed by an anisotropic process. A gate oxide film (not shown) is deposited on the gate region.

A conductive material 230 is deposited on the resultant surface including the gate region where a gate oxide film is formed, thereby forming a buried gate 235. The conductive material 230 includes polysilicon, aluminum (Al), tungsten (W), tungsten nitride (WN), titanium (Ti), titanium nitride (TiN) or a combination thereof, e.g., a stack including titanium nitride (TiN) and tungsten (W). The buried gate 235 includes an active gate 240 and a dummy gate 240' and the buried gate 235 is formed in a line pattern. No isolation process is required between is the active regions 210 because a gate voltage is maintained at an off state in the dummy gate 240'.

Referring to FIG. 2b, the conductive material 230 forming the dummy gate 240' is first etched with a mask 250 for exposing the dummy gate 240' as an etching mask. The first etching process is performed by an anisotropic process so as to etch the conductive material 230 at a depth ranging from 100 Å to 500 Å.

Referring to FIG. 2c, after the mask 250 for exposing the dummy gate 240' is removed, the conductive materials 230 forming the dummy gate 240' and the active gate 240 are etched. The secondary etching process is performed by an anisotropic process. Since the conductive material 230 forming the dummy gate 240' is etched twice by the first and second etching processes, the dummy gate 240' has a lower height than that of the active gate 240. The smaller the height of the conductive material 230 forming the dummy gate 240', the higher a threshold voltage of a cell transistor and the smaller an overlapped area between the conductive material 230 and source/drain regions of the active region 210. Therefore, the Gate Induced Drain Leakage (GIDL) can be counteracted and improve the refresh characteristic of a semiconductor device.

In an embodiment, the order of the first and second etch processes can be reversed. That is, the first etch process performed on the conductive material 230 of the dummy gate 240' can be performed after the second etch process is performed on the conductive material 230 of the active gate 240 and the dummy gate 240' according to implementation.

An insulating material 260 is deposited on the resultant structure including the active gate 240 and the dummy gate 240'. The insulating material 260 includes any of a SOD film, a Spin On Carbon (SOC) and $SiO_2$. Thereafter, a CMP process is performed to expose the active region 210.

As described above, the present invention includes forming a buried gate after forming an active region to have a line type. The buried gate includes an active gate and a dummy gate. A height of a gate electrode layer (conductive material) of the dummy gate is formed to be lower than that of a gate electrode layer of the active gate, thereby increasing a threshold voltage and preventing an overlap of the ion-implanted active region with the dummy gate. As a result, a Gate Induced Drain Leakage (GIDL) is prevented to improve a refresh characteristic of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a device isolation region that defines an active region in a semiconductor substrate;
   etching the semiconductor substrate to form a gate region having a first recess and a second recess;
   depositing a conductive material over the gate region and within the first and second recesses; to form a including an active gate in the first recess and a dummy gate in the second recess;
   etching the conductive material provided in the second recess while preventing the conductive material provided in the first recess from being etched;
   etching the conductive material provided in the first and second recesses; and
   depositing an insulating film over the semiconductor substrate and the conductive material within the first and second recesses,
   wherein the conductive material in the first recess defines an active gate and the conductive material in the second recess defines a dummy gate.

2. The method according to claim 1, wherein the active region has a line pattern, and
   wherein the dummy gate has a lower height than the active gate, the dummy gate being configured to be maintained at an off state.

3. The method according to claim 1, wherein the conductive material includes any of polysilicon, aluminum (Al), tungsten (W), tungsten nitride (WN), titanium (Ti), titanium nitride (TiN) and a combination thereof.

4. The method according to claim 1, wherein the etching-the-semiconductor-substrate-to-form-a-gate-region step includes performing an anisotropic etch on the semiconductor substrate.

5. The method according to claim 1, wherein the etching-the-conductive-material-provided-in-the-second-recess step and the etching-the-conductive-material-provided-in-the-first-and-second-recesses step are anisotropic etch steps, and
   wherein the etching-the-conductive-material-provided-in-the-second-recess step is performed before the etching-the-conductive-material-provided-in-the-first-and-second-recesses step.

6. The method according to claim 1, further comprising:
   performing a chemical mechanical polishing (CMP) on the insulating film to expose the active region,
   wherein the etching-the-conductive-material-provided-in-the-second-recess step is performed after the etching-the-conductive-material-provided-in-the-first-and-second-recesses step.

7. The method according to claim 1, wherein the active gate and the dummy have a line pattern.

8. The method according to claim 1, wherein the height of the dummy gate is smaller than that of the active gate.

9. The method according to claim 1, further comprising:
   implanting N-type impurities into the active region to form an N-type junction at a side of the active gate.

10. A method for manufacturing a semiconductor device, the method comprising:
    forming a device isolation region that defines an active region in a semiconductor substrate;
    etching the semiconductor substrate to form a first recess and a second recess;
    depositing a conductive material within the first recess and the second recess;
    performing a first etch step to etch the conductive material in the first recess and the second recess;
    performing a second etch step to etch the conductive material of the second recess without etching the conductive material in the first recess; and
    depositing an insulating film over the semiconductor substrate and within the first and second recesses,
    wherein the conductive material in the first recess defines an active gate and the conductive material in the second recess defines a dummy gate that is maintained at an off state, and
    wherein the dummy gate is provided with a height that is less than that of the active gate.

11. The method according to claim 10, wherein the conductive material includes any of polysilicon, aluminum (Al), tungsten (W), tungsten nitride (WN), titanium (Ti), titanium nitride (TiN) and a combination thereof.

12. The method according to claim 10, wherein the first etch step is performed before the second etch step.

13. The method according to claim 10, wherein the first and second etch steps are anisotropic etch steps.

14. The method according to claim 10, wherein the active gate and the dummy gate have a line pattern.

15. The method according to claim 10, wherein the second etch step is performed before the first etch step.

16. The method according to claim 10, further comprising:
    performing a chemical mechanical polishing (CMP) on the insulating film to expose the active region.

* * * * *